(12) United States Patent
Shibui

(10) Patent No.: US 7,687,208 B2
(45) Date of Patent: Mar. 30, 2010

(54) POSITIVE PHOTOSENSITIVE RESIN COMPOSITION

(75) Inventor: Satoshi Shibui, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 0 days.

(21) Appl. No.: 12/309,766

(22) PCT Filed: Aug. 10, 2007

(86) PCT No.: PCT/JP2007/065729

§ 371 (c)(1),
(2), (4) Date: Jan. 29, 2009

(87) PCT Pub. No.: WO2008/020573

PCT Pub. Date: Feb. 21, 2008

(65) Prior Publication Data

US 2009/0202794 A1    Aug. 13, 2009

(30) Foreign Application Priority Data

Aug. 15, 2006 (JP) .............................. 2006-221346

(51) Int. Cl.
G03F 7/023 (2006.01)
G03F 7/30 (2006.01)
(52) U.S. Cl. .................. 430/18; 430/191; 430/192; 430/193; 430/326; 430/330
(58) Field of Classification Search .................. 430/18, 430/191, 192, 193, 326, 330
See application file for complete search history.

(56) References Cited

U.S. PATENT DOCUMENTS

| 4,009,033 | A | 2/1977 | Bakos et al. |
| 4,339,521 | A | 7/1982 | Ahne et al. |
| 6,071,666 | A * | 6/2000 | Hirano et al. ............... 430/191 |
| 6,235,436 | B1 * | 5/2001 | Hirano et al. ................. 430/18 |
| 7,407,731 | B2 * | 8/2008 | Naiini et al. .................. 430/18 |

FOREIGN PATENT DOCUMENTS

| JP | 63-96162 | 4/1988 |
| JP | 1-46862 | 10/1989 |
| JP | 9-138505 | 5/1997 |
| JP | 2000-131845 | 5/2000 |
| JP | 2000-338664 | 12/2000 |
| JP | 2001-343747 | 12/2001 |
| JP | 2003-149816 | 5/2003 |
| JP | 2003-345019 | 12/2003 |
| JP | 2003-345021 | 12/2003 |
| JP | 2004-29712 | 1/2004 |
| JP | 2004-212679 | 7/2004 |
| JP | 2005-157327 | 6/2005 |
| JP | 2005-250160 | 9/2005 |
| JP | 2006-178437 | 7/2006 |
| WO | WO 2007/049524 A1 | 5/2007 |

* cited by examiner

Primary Examiner—John S Chu
(74) Attorney, Agent, or Firm—Finnegan, Henderson, Farabow, Garrett & Dunner, L.L.P.

(57) ABSTRACT

A positive photosensitive resin composition excellent in sensitivity and resolution, characterized by comprising 100 parts by mass of (A) a hydroxypolyamide comprising repeating units represented by the general formula (1), 1 to 50 parts by mass of (B) a photoacid generator, 5 to 20 parts by mass of (C) a carboxylic acid compound having 6 to 18 carbon atoms as represented by the general formula (2), and 0.01 to 70 parts by mass of (D) an alcohol having 4 to 14 carbon atoms as represented by the general formula (3).

7 Claims, No Drawings

POSITIVE PHOTOSENSITIVE RESIN COMPOSITION

TECHNICAL FIELD

The present invention relates to a positive photosensitive resin composition serving as a precursor of a heat-resistant resin used as a passivation film and an interlayer insulating film for semiconductor devices; a process for producing a heat-resistant cured relief pattern employing the positive photosensitive resin composition; and a semiconductor device having the cured relief pattern.

BACKGROUND ART

A polyimide resin, which combines excellent heat resistance, electrical properties, mechanical properties, and the like, is widely used in passivation films and interlayer insulating films for semiconductor devices. Generally, the polyimide resin is now often provided in the form of a photosensitive polyimide precursor composition. In the process of producing a semiconductor device, the precursor composition can be coated on a substrate such as a silicon wafer, patterned with an active light, developed, and subjected to heat imidization treatment to easily form a passivation film or an interlayer insulating film serving as a part of the semiconductor device. Thus, the process for producing a semiconductor device using the photosensitive polyimide precursor composition has a feature of enabling the reduction of the production steps compared to a conventional production process using a nonphotosensitive polyimide precursor composition instead, which requires the formation of a passivation film before patterning by lithography.

However, the photosensitive polyimide precursor composition requires the use of an organic solvent such as N-methyl-2-pyrrolidone as a developing solution in the process of the development thereof, and thus, there has been a need for such a countermeasure for preventing the use of the organic solvent in view of increased recent concern over environmental issues and the like. In response to this need, various proposals of heat-resistant photosensitive resin materials which can be developed with an alkaline aqueous solution have been recently made as shown in the case of a photoresist.

Among them, attention is now focused on a method disclosed in PATENT DOCUMENTS 1 and 2 which involves mixing an alkaline aqueous solution-soluble hydroxypolyamide such as a polybenzoxazole (hereinafter also referred to as "PBO") precursor, which becomes a heat-resistant resin after curing, with a photo-acid generator (hereinafter also referred to as "PAC") such as a photosensitive diazoquinone compound to use the resultant PBO precursor composition as a positive photosensitive resin composition.

Whereas the photosensitive diazoquinone compound and the PBO precursor in unexposed areas have small rates of dissolution in an alkaline aqueous solution, the exposure induces the chemical change of the photosensitive diazoquinone compound into an indene carboxylic acid compound to increase the rate of dissolution of exposed areas in the alkaline aqueous solution. The mechanism for developing the positive photosensitive resin composition utilizes this. The difference in the rate of dissolution in a developing solution between the exposed and unexposed areas is used to enable the formation of a relief pattern consisting of the unexposed areas.

The above PBO precursor composition can be exposed and developed with an alkaline aqueous solution to form a positive relief pattern. In addition, heat produces the formation of an oxazole ring to allow a cured PBO film to come to have heat-cured film characteristics comparable to those of a polyimide film. Thus, attention is focused on the PBO precursor composition as a promising alternative material for an organic solvent-developed polyimide precursor composition.

However, since the PBO precursor composition has a problem that it is low in sensitivity compared to the photosensitive polyimide precursor composition, there is a need for a composition having a higher sensitivity.

PATENT DOCUMENT 3 proposes a photosensitive resin composition containing an alkaline aqueous solution-soluble polymer, an o-quinone diazide compound, and an acidic compound such as formic acid and acetic acid as essential ingredients and thereby having a high sensitivity as well as excellent storage stability, stable photosensitive characteristics, and good heat resistant properties. In addition, PATENT DOCUMENT 4 proposes a positive photosensitive resin composition having a high sensitivity as well as stable photosensitive characteristics and good heat resistant properties, which consists essentially of a polyimide precursor or a polybenzoxazole precursor, a compound generating an acid by active actinic ray irradiation, a compound having an acid decomposable group of which solubility in an alkaline aqueous solution is increased by an acid catalyzed reaction, a compound containing 2 or more alcoholic hydroxy groups, and a solvent.

PATENT DOCUMENT 1: JP-B-1-46862
PATENT DOCUMENT 2: JP-A-63-96162
PATENT DOCUMENT 3: JP-A-2000-338664
PATENT DOCUMENT 4: JP-A-2003-345019

DISCLOSURE OF THE INVENTION

Problems to be Solved by the Invention

An object of the present invention is to provide a positive photosensitive resin composition which is excellent in positive lithography performances, such as high sensitivity and high resolution, and in adhesion to a silicon substrate; a process for producing a cured relief pattern using the composition; and a semiconductor device having the cured relief pattern.

Means for Solving the Problems

The present inventor has found that a carboxylic acid compound having a particular structure and an alcohol having a particular structure are combined with a hydroxypolyamide having a particular structure to provide a positive photosensitive resin composition which can solve the above problems, thereby accomplishing the present invention.

Specifically, a first aspect of the present invention is a positive photosensitive resin composition characterized by comprising (A) 100 parts by mass of a hydroxypolyamide having repeating units represented by the following general formula (1) in combination with (B) 1 to 50 parts by mass of a photo-acid generator, (C) 5 to 20 parts by mass of a carboxylic acid compound having 6 to 18 carbon atoms represented by the following general formula (2), and (D) 0.01 to 70 parts by mass of an alcohol having 4 to 14 carbons represented by the following general formula (3).

[Formula 1]

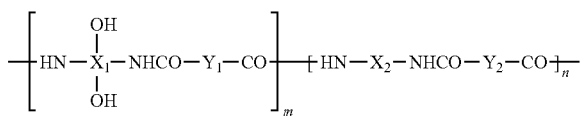

(1)

In the formula (1), $X_1$ represents a tetravalent organic group having at least two carbon atoms; $X_2$, $Y_1$, and $Y_2$ each independently represent a divalent organic group having at least two carbon atoms; m represents an integer of 2 to 1,000; n represents an integer of 0 to 500; and m/(m+n)≥0.5. In addition, m units of a dihydroxydiamide containing $X_1$ and $Y_1$ and n units of a diamide containing $X_2$ and $Y_2$ may be sequenced in any order.

[Formula 2]

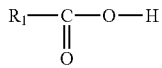

(2)

In the formula (2), $R_1$ represents a monovalent organic group having 5 to 17 carbon atoms.

[Formula 3]

(3)

In the formula (3), $R_2$ represents a monovalent or divalent organic group having 4 to 14 carbon atoms, and p represents an integer of 1 to 2.

[Formula 5]

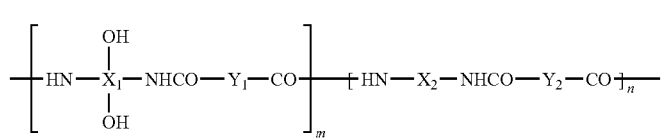

(1)

In the composition of the present invention, the photo-acid generator is preferably a compound having a naphthoquinone diazide structure, and the (D) alcohol is preferably a compound represented by the following general formula (4).

[Formula 4]

(4)

In the formula (4), $R_3$ represents a monovalent organic group having; a branched structure, a cyclic structure or an unsaturated double bonding; and 4 to 14 carbon atoms.

A second aspect of the present invention is a process for producing a cured relief pattern, characterized by comprising (1) forming the above positive photosensitive resin composition in the form of a layer or film on a substrate, (2) exposing the layer or film to actinic rays via a mask, or directly irradiating it with light, electron beams or ion beams, (3) eluting and removing the exposed or irradiated areas, and (4) subjecting the resultant relief pattern to heat treatment.

Furthermore, a third aspect of the present invention is a semiconductor device having the cured relief pattern obtained by the above production process.

ADVANTAGES OF THE INVENTION

The present invention provides a positive photosensitive resin composition which is excellent in positive lithography performances, such as high sensitivity and high resolution, and in adhesion to a silicon substrate; a process for producing a cured relief pattern using the positive photosensitive resin composition; and a semiconductor device having the cured relief pattern.

BEST MODE FOR CARRYING OUT THE INVENTION

<Positive Photosensitive Resin Composition>

The components constituting the positive photosensitive resin composition of the present invention will be specifically described below.

(A) Hydroxypolyamide

The hydroxypolyamide which is a base polymer for the positive photosensitive resin composition of the present invention has m units of a dihydroxydiamide in the general formula (1) below. The dihydroxydiamide unit has a structure in which a dicarboxylic acid having a structure of $Y_1(COOH)_2$ is polycondensated with a bisaminophenol having a structure of $X_1(NH_2)_2(OH)_2$. Two pairs of an amino group and a hydroxy group of the bisaminophenol are each located at the ortho position to each other. The hydroxypolyamide is cyclized by heating at about 280 to 400° C. and thereby changed into a polybenzoxazole which is a heat-resistant resin. m is preferably in the range of 2 to 1,000, more preferably in the range of 3 to 50, most preferably in the range of 3 to 30.

The hydroxypolyamide may optionally have n units of a diamide in the above general formula (1). The diamide unit has a structure in which a diamine having a structure of $X_2(NH_2)_2$ is polycondensated with a dicarboxylic acid having a structure of $Y_2(COOH)_2$. n is preferably in the range of 0 to 500, more preferably in the range of 0 to 10.

A higher proportion of the dihydroxydiamide unit in the hydroxypolyamide enhances the solubility in an alkaline aqueous solution used as a developing solution. Thus, m/(m+n) is preferably 0.5 or more, more preferably 0.7 or more, most preferably 0.8 or more.

Examples of the bisaminophenol having a structure of $X_1(NH_2)_2(OH)_2$ include 3,3'-dihydroxybenzidine, 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis(3-amino-4-hydroxyphenyl)methane, 2,2-bis(3-amino-4-hydroxyphenyl)propane, 2,2-bis(3-amino-4-hydroxyphenyl)hexafluoropropane, 2,2-bis(4-amino-3-hydroxyphenyl)hexafluoropropane, bis(4-amino-3-hydroxyphenyl)methane, 2,2-bis(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, and 1,3-diamino-4,6-dihydroxybenzene. These bisaminophenols may be used alone or in a mixture thereof.

Among the above bisaminophenols which each has a structure of $X_1(NH_2)_2(OH)_2$, particularly preferred is a bisaminophenol in which $X_1$ is an aromatic group selected from the following.

[Formula 6]

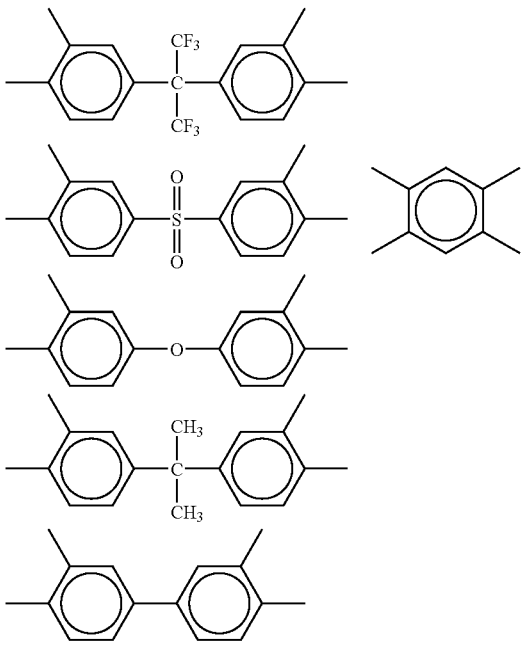

A diamine intramolecularly having two pairs of an amide bond and a phenolic hydroxy group located at the ortho position to each other (hereinafter referred to as "a diamine intramolecularly having a PBO precursor structure") may also be used as the compound having a structure of $X_1(NH_2)_2(OH)_2$. Examples thereof include a diamine represented by the following general formula, which is obtained by reacting two molecules of nitrobenzoic acid with a bisaminophenol molecule having the above $X_1(NH_2)_2(OH)_2$ structure to reduce the bisaminophenol.

[Formula 7]

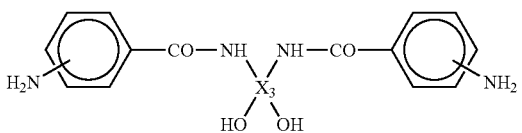

In the formula, $X_3$ represents a tetravalent organic group having at least two carbon atoms, and preferably represents at least one organic group selected from the group consisting of the above-described groups which are preferable as organic groups represented by $X_1$.

Alternatively, the diamine intramolecularly having a PBO precursor structure is also obtained as a diamine represented by the following general formula by a method which involves reacting two molecules of nitroaminophenol with a dicarboxylic acid dichloride having a structure of $Y_3(COCl)_2$ for reduction.

[Formula 8]

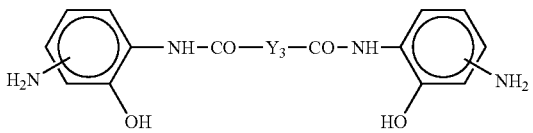

In the formula, $Y_3$ represents a divalent organic group having at least two carbon atoms, and preferably represents at least one organic group selected from the group consisting of the groups which are preferable as organic groups represented by $Y_1$ as described below.

Examples of the diamine having a structure of $X_2(NH_2)_2$ include an aromatic diamine and a silicon diamine.

Among these, examples of the aromatic diamine include m-phenylenediamine, p-phenylenediamine, 2,4-tolylenediamine, 3,3'-diaminodiphenyl ether, 3,4'-diaminodiphenyl ether, 4,4'-diaminodiphenyl ether, 3,3'-diaminodiphenylsulfone, 4,4'-diaminodiphenylsulfone, 3,4'-diaminodiphenylsulfone, 3,3'-diaminodiphenylmethane, 4,4'-diaminodiphenylmethane, 3,4'-diaminodiphenylmethane, 4,4'-diaminodiphenyl sulfide, 3,3'-diaminodiphenyl ketone, 4,4'-diaminodiphenyl ketone, 3,4'-diaminodiphenyl ketone, 2,2'-bis(4-aminophenyl)propane, 2,2'-bis(4-aminophenyl)hexafluoropropane, 1,3-bis(3-aminophenoxy)benzene, 1,3-bis(4-aminophenoxy)benzene, 1,4-bis(4-aminophenoxy)benzene, 4-methyl-2,4-bis(4-aminophenyl)-1-pentene, 4-methyl-2,4-bis(4-aminophenyl)-2-pentene, 1,4-bis(α,α-dimethyl-4-aminobenzyl)benzene, imino-di-p-phenylenediamine, 1,5-diaminonaphthalene, 2,6-diaminonaphthalene, 4-methyl-2,4-bis(4-aminophenyl)pentane, 5(or 6)-amino-1-(4-aminophenyl)-1,3,3-trimethylindan, bis(p-aminophenyl) phosphine oxide, 4,4'-diaminoazobenzene, 4,4'-diaminodiphenylurea, 4,4'-bis(4-aminophenoxy)biphenyl, 2,2-bis[4-(4-aminophenoxy)phenyl]propane, 2,2-bis[4-(4-aminophenoxy)phenyl]hexafluoropropane, 2,2-bis[4-(3-aminophenoxy)phenyl]benzophenone, 4,4'-bis(4-aminophenoxy)diphenylsulfone, 4,4'-bis[4-(α,α-dimethyl-4-aminobenzyl)phenoxy]benzophenone, 4,4'-bis[4-(α,α-dimethyl-4-aminobenzyl)phenoxy]diphenylsulfone, 4,4'-diaminobiphenyl, 4,4'-diaminobenzophenone, phenylindandiamine, 3,3'-dimethoxy-4,4'-diaminobiphenyl, 3,3'-dimethyl-4,4'-diaminobiphenyl, o-toluidine sulfone, 2,2-bis(4-aminophenoxyphenyl)propane, bis(4-aminophenoxyphenyl) sulfone, bis(4-aminophenoxyphenyl) sulfide, 1,4-(4-aminophenoxyphenyl)benzene, 1,3-(4-aminophenoxyphenyl)benzene, 9,9-bis(4-aminophenyl)fluorene, 4,4'-di-(3-aminophenoxy) diphenylsulfone, and 4,4'-diaminobenzanilide, and these aromatic diamines in each of which the hydrogens of the aromatic nucleus are substituted with at least one group or atom selected from the group consisting of a chlorine atom, a fluorine atom, a bromine atom, a methyl group, a methoxy group, a cyano group, and a phenyl group.

To enhance the adhesion to the substrate, a silicon diamine may be selected in the whole or part of the diamine having a structure of $X_2(NH_2)_2$. Examples thereof include bis(4-aminophenyl)dimethylsilane, bis(4-aminophenyl)tetramethylsiloxane, bis(4-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, and bis(γ-aminopropyl)tetraphenyldisiloxane.

Examples of the dicarboxylic acids having structures of $Y_1(COOH)_2$ and $Y_2(COOH)_2$ include dicarboxylic acids in which $Y_1$ and $Y_2$ are each an aromatic group or an aliphatic group selected from the following.

[Formula 9]

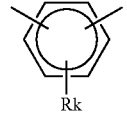 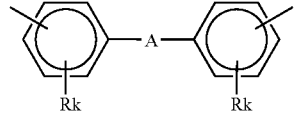

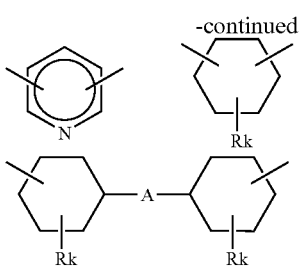

In the formulas, A represents a divalent group selected from the group consisting of —CH$_2$—, —O—, —S—, —SO$_2$—, —CO—, —NHCO—, —C(CF$_3$)$_2$—, and single bonding; R's each independently represent a group selected from the group consisting of a hydrogen atom, an alkyl group, an unsaturated group, and a halogen atom; and k represents an integer of 0 to 4.

A derivative of 5-aminoisophthalic acid may also be used in the whole or part of each of the above dicarboxylic acids having the Y$_1$(COOH)$_2$ and Y$_2$(COOH)$_2$ structures. Specific examples of the compound allowed to react with 5-aminoisophthalic acid to obtain a derivative of 5-aminoisophthalic acid include 5-norbornene-2,3-dicarboxylic anhydride, exo-3,6-epoxy-1,2,3,6-tetrahydrophthalic anhydride, 3-ethynyl-1,2-phthalic anhydride, 4-ethynyl-1,2-phthalic anhydride, cis-4-cyclohexene-1,2-dicarboxylic anhydride, 1-cyclohexene-1,2-dicarboxylic anhydride, maleic anhydride, citraconic anhydride, itaconic anhydride, endomethylenetetrahydrophthalic anhydride, methylendomethylenetetrahydrophthalic anhydride, methyltetrahydrophthalic anhydride, allylsuccinic anhydride, isocyanatoethylmethacrylate, 3-isopropenyl-α,α-dimethylbenzyl isocyanate, 3-cyclohexene-1-carboxylic acid chloride, 2-furancarboxylic acid chloride, crotonic acid chloride, cinnamic acid chloride, methacrylic acid chloride, acrylic acid chloride, propiolic acid chloride, tetrolic acid chloride, thiophene-2-acetyl chloride, p-styrenesulfonyl chloride, glycidyl methacrylate, allyl glycidyl ether, methyl chloroformate, ethyl chloroformate, n-propyl chloroformate, isopropyl chloroformate, isobutyl chloroformate, 2-ethoxy chloroformate, sec-butyl chloroformate, benzyl chloroformate, 2-ethylhexyl chloroformate, allyl chloroformate, phenyl chloroformate, 2,2,2-trichloroethyl chloroformate, 2-butoxyethyl chloroformate, p-nitrobenzyl chloroformate, p-methoxybenzyl chloroformate, isobornylbenzyl chloroformate, p-biphenylisopropylbenzyl chloroformate, 2-t-butyloxycarbonyl-oxyimino-2-phenylacetonitrile, S-t-butyloxycarbonyl-4,6-dimethyl-thiopyrimidine, di-t-butyl-dicarbonate, N-ethoxycarbonylphthalimide, ethyldithiocarbonyl chloride, formic acid chloride, benzoyl chloride, p-toluenesulfonic acid chloride, methanesulfonic chloride, acetyl chloride, trityl chloride, trimethylchlorosilane, hexamethyldisilazane, N,O-bis(trimethylsilyl)acetamide, bis(trimethylsilyl)trifluoroacetamide, (N,N-dimethylamino)trimethylsilane, (dimethylamino)trimethylsilane, trimethylsilyl diphenylurea, bis(trimethylsilyl)urea, phenyl isocyanate, n-butyl isocyanate, n-octadecyl isocyanate, o-tolyl isocyanate, 1,2-phthalic anhydride, and cis-1,2-cyclohexanedicarboxylic anhydride, and glutaric anhydride.

In addition, a dicarboxylic acid obtained by ring-opening tetracarboxylic dianhydride with a monoalcohol or a monoamine may also be used as the dicarboxylic acid having a Y$_1$(COOH)$_2$ or Y$_2$(COOH)$_2$ structure. Here, examples of the monoalcohol include methanol, ethanol, propanol, isopropanol, butanol, t-butanol, and benzylalcohol. Examples of the monoamine include butylamine and aniline. Examples of the tetracarboxylic dianhydride include compounds represented by the following chemical formulas.

[Formula 10]

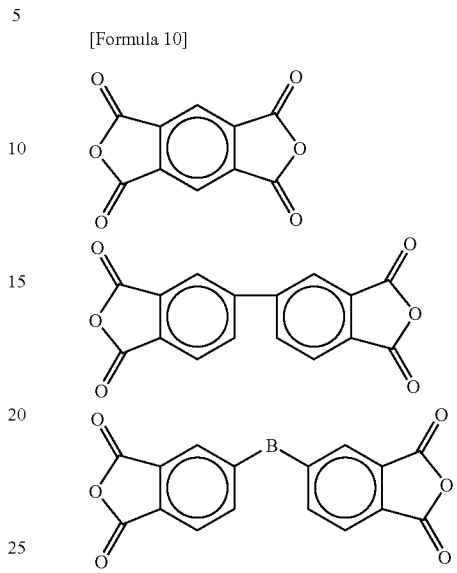

In the formula, B represents a divalent group selected from the group consisting of —CH$_2$—, —O—, —S—, —SO$_2$—, —CO—, —NHCO—, and —C(CF$_3$)$_2$—.

Alternatively, the tetracarboxylic dianhydride can also be reacted with a bisaminophenol or a diamine, followed by esterifying or amidating the generated carboxylic acid residue with a monoalcohol or a monoamine.

Trimellitic acid chloride may also be reacted with the bisaminophenol to form a tetracarboxylic dianhydride, which is then ring-opened by the same method as for the above tetracarboxylic dianhydride to use as the dicarboxylic acid. Examples of the tetracarboxylic dianhydride obtained here include a chemical formula represented by the following chemical formula.

[Formula 11]

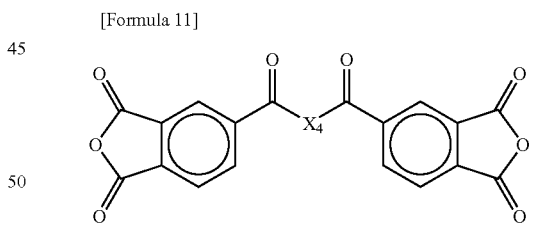

In the formula, X$_4$ represents a divalent organic group represented by X$_1$(OH)$_2$(NH—)$_2$.

Examples of a method for polycondensing the above-described dicarboxylic acid and bisaminophenol (diamine) to synthesize the hydroxypolyamide include a method involving using the dicarboxylic acid and thionyl chloride to make a diacid chloride, on which the bisaminophenol (diamine) is then allowed to act, or a method involving polycondensing the dicarboxylic acid and bisaminophenol (diamine) using dicyclohexylcarbodiimide. In the method using dicyclohexylcarbodiimide, hydroxybenztriazole may also be allowed to act simultaneously.

The hydroxypolyamide having the repeating units represented by the above general formula (1) is preferably also used after capping the terminal group thereof with an organic group (hereinafter referred to as "a capping group"). In the polycondensation for forming the hydroxypolyamide, when the dicarboxylic acid component is used in an excess number of moles compared to the sum of those of the bisaminophenol component and the diamine component, a compound having an amino group or a hydroxy group as a capping group is preferably employed. Examples of the compound include aniline, ethinylaniline, norbornene amine, butylamine, propargylamine, ethanol, propargyl alcohol, benzyl alcohol, hydroxyethyl methacrylate, and hydroxyethyl acrylate.

Conversely, when the sum of the bisaminophenol component and the diamine component is used in an excess number of moles compared to that of the dicarboxylic acid component, an acid anhydride, carboxylic acid, acid chloride or compound having an isocyanate group is preferably employed as the capping group. Examples of the compound include benzoyl chloride, norbornenedicarboxylic anhydride, norbornenecarboxylic acid, ethynylphthalic anhydride, glutaric anhydride, maleic anhydride, phthalic anhydride, cyclohexanedicarboxylic anhydride, methylcyclohexanedicarboxylic anhydride, cyclohexenedicarboxylic anhydride, methacryloyloxyethyl methacrylate, phenyl isocyanate, mesyl chloride, and tosylic acid chloride.

(B) Photo-Acid Generator

As the photo-acid generator contained in the positive photosensitive resin composition of the present invention there may be used a compound having a naphthoquinone diazide structure such as an onium salt, a halogen-containing compound. The compound having a naphthoquinone diazide structure is preferable.

Examples of the onium salt include an iodonium salt, a sulfonium salt, a phosphonium salt, an ammonium salt, and a diazonium salt; preferred is an onium salt selected from the group consisting of a diaryliodonium salt, a triarylsulfonium salt, and a trialkylsulfonium salt.

Examples of the halogen-containing compound include a haloalkyl group-containing hydrocarbon compound; preferred is trichloromethyl triazine.

The compound having a naphthoquinone diazide structure is a compound having a 1,2-naphthoquinone diazide structure, which is a known substance in U.S. Pat. Nos. 2,772,972, 2,797,213, 3,669,658, and the like. The compound having a naphthoquinone diazide structure is at least one compound selected from the group consisting of a 1,2-naphthoquinone diazide-4-sulfonate of a polyhydroxy compound and a 1,2-naphthoquinone diazide-5-sulfonate of the polyhydroxy compound (hereinafter also referred to as "an NQD compound").

The NQD compound is obtained by, according to the ordinary method, converting a naphthoquinone diazide sulfonic acid compound to a sulfonylchloride using chlorosulfonic acid or thionyl chloride and subjecting the resultant naphthoquinone diazide sulfonyl chloride and a polyhydroxy compound to condensation reaction. For example, the NQD compound can be obtained by reacting a polyhydroxy compound with a predetermined amount of 1,2-naphthoquinone diazide-5-sulfonylchloride or 1,2-naphthoquinone diazide-4-sulfonyl chloride in the solvent of dioxan, acetone, or tetrahydrofuran in the presence of the basic catalyst of triethylamine for esterification and water-washing and drying the resultant product.

Specific compounds include, but not limited to, the NQD compounds of a polyhydroxy compound described below.

[Formula 12]

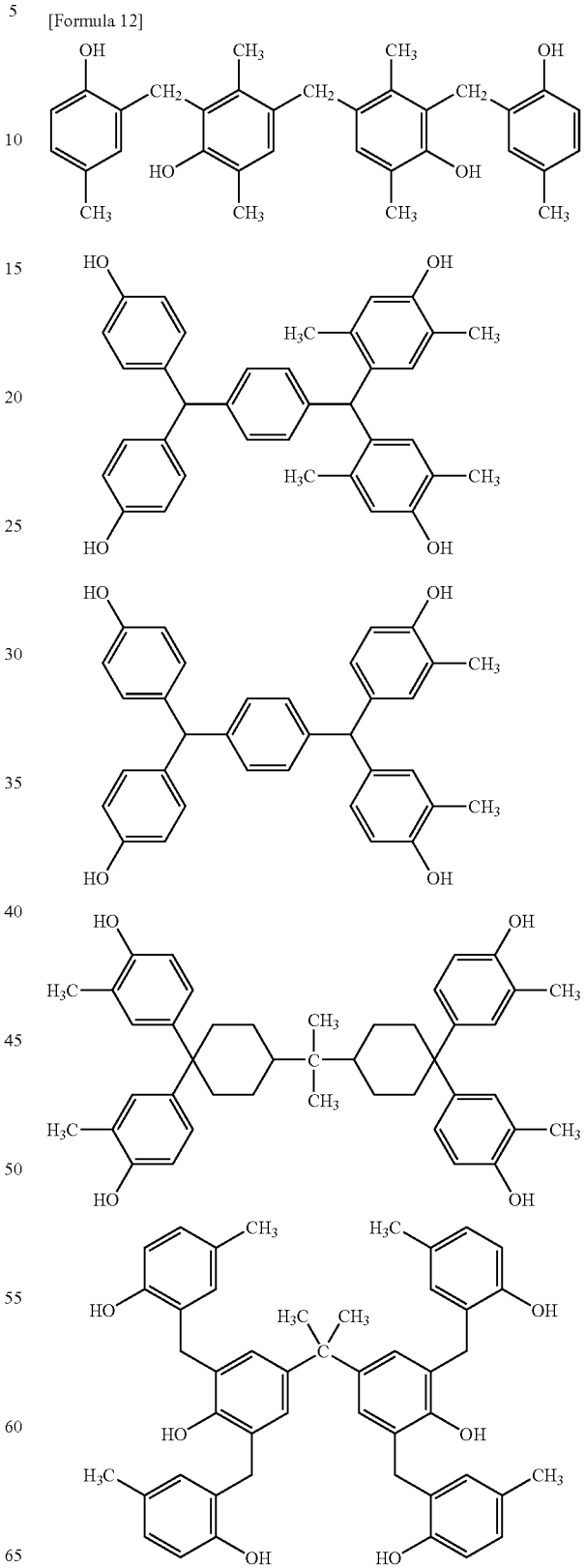

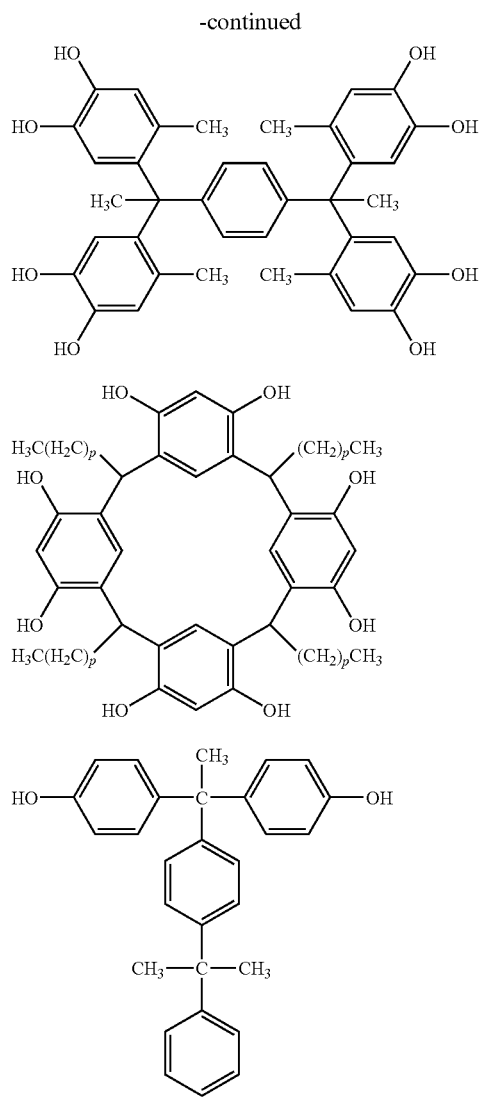
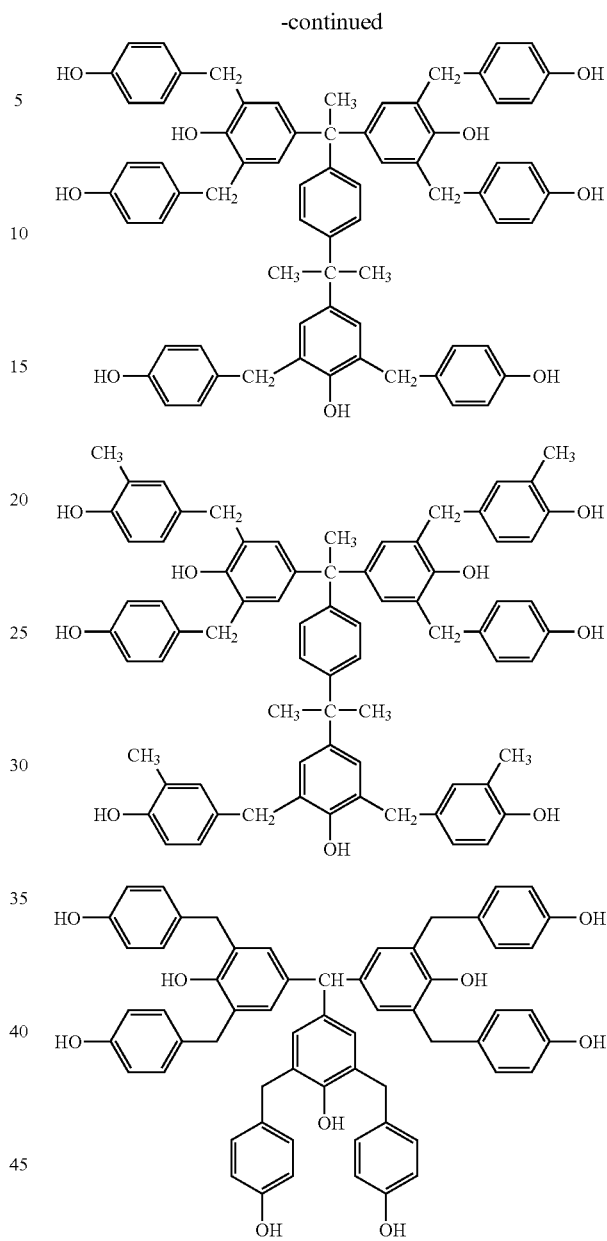
In the formula, p represents an integer of 0 to 9.
[Formula 13]
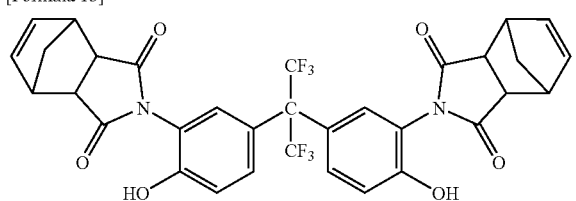
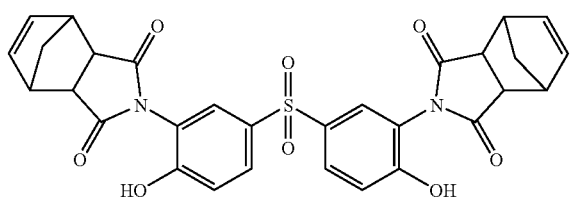
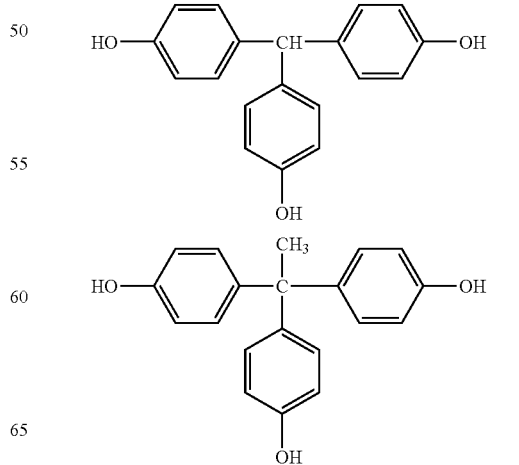

-continued

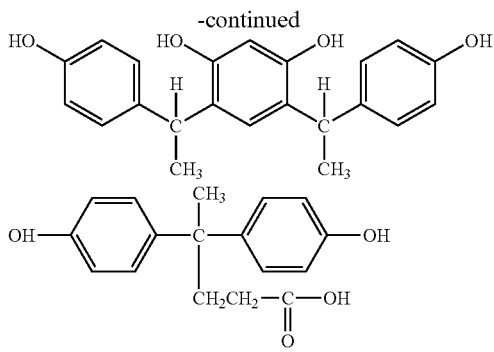

In the present composition, any of a 5-naphthoquinone diazide sulfonyl group and a 4-naphthoquinone diazide sulfonyl group is preferably used as the naphthoquinone diazide sulfonyl group of the NQD compound. The 4-naphthoquinone diazide sulfonyl ester compound has absorption in the region of i-beam from a mercury lamp and is suitable for exposure to i-beam. The 5-naphthoquinone diazide sulfonyl ester compound has absorption extending to the region of g-beam from the mercury lamp and is suitable for exposure to g-beam. According to the present invention, the 4-naphthoquinone diazide sulfonyl ester compound or the 5-naphthoquinone diazide sulfonyl ester compound is preferably selected depending on the wavelength used for exposure. In addition, a naphthoquinone diazide sulfonyl ester compound combining a 4-naphthoquinone diazide sulfonyl group and a 5-naphthoquinone diazide sulfonyl group in the same molecule may be obtained, and the 4-naphthoquinone diazide sulfonyl ester compound and the 5-naphthoquinone diazide sulfonyl ester compound may also be used in a mixture thereof. In the present composition, the photo-acid generator is preferably blended in an amount of 1 to 50 parts by mass, more preferably 5 to 30 parts by mass to 100 parts by mass of the hydroxypolyamide. The blending amount of the photo-acid generator of 1 part by mass or more makes the patterning property of the resin favorable; 50 parts by mass or less renders the tensile elongation of the cured film good and reduces the undeveloped residue (scum) of exposed areas.

(C) Carboxylic Acid Compound

The carboxylic acid compound used in the present invention is a carboxylic acid compound having to 18 carbon atoms represented by the following general formula (2).

[Formula 14]

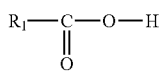
(2)

In the formula, $R_1$ is an organic group having 5 to 17 carbon atoms.

Specific examples thereof include sorbic acid, lauric acid, myristic acid, oleic acid, 2-methyl-4-pentenoic acid, 4-methyl-2-pentenoic acid, 2-methyl-2-pentenoic acid, 2-methyl-n-valeric acid, 3-methyl-n-valeric acid, 4-methyl-n-valeric acid, 2-ethylbutyric acid, heptanoic acid, octanoic acid, n-nonanoic acid, isononanoic acid, decanoic acid, DL-leucinic acid, N-acetyl-DL-methionine, 2-heptenoic acid, 2-octenoic acid, 2-nonenoic acid, 2-decenoic acid, 9-decenoic acid, 2-dodecenoic acid, 10-undecenoic acid, 3-cyclohexene-1-carboxylic acid, 1-cyclohexene-3-carboxylic acid, cyclohexanecarboxylic acid, cyclopentylacetic acid, cyclohexylacetic acid, cyclohexylpropionic acid, 4-cyclohexanebutyric acid, 5-norbornene-2-carboxylic acid, m-anisic acid, m-toluic acid, m-tolylacetic acid, o-anisic acid, o-toluic acid, o-tolylacetic acid, p-anisic acid, p-toluic acid, p-tolylacetic acid, and benzoic acid.

Among others, preferred is a carboxylic acid compound in which $R_1$ is a monovalent organic group having a branched or cyclic structure or unsaturated double bonding.

Specific examples thereof include 2-nonenoic acid, isononanoic acid, 10-undecenoic acid, 3-cyclohexene-1-carboxylic acid, m-anisic acid, m-toluic acid, and m-tolylacetic acid.

The carboxylic acid compound added remains in a certain amount in the film after soft baking to exert the effect thereof. Thus, a carboxylic acid compound having 5 carbons or less is not preferable because it may hardly remain in the film after soft baking. On the other hand, a carboxylic acid compound having 19 carbons or more is not preferable because it very slightly dissolves uniformly in the composition.

These carboxylic acid compounds may be used alone or in a mixture of two or more.

The carboxylic acid compound is preferably blended in an amount of 5 to 20 parts by mass to 100 parts by mass of the hydroxypolyamide. The blending amount of the carboxylic acid compound of 5 parts by mass or more reduces the undeveloped residue of exposed areas and makes the adhesion to a silicon substrate favorable. The blending amount of 20 parts by mass or less renders the tensile elongation of the cured film good.

(D) Alcohol

The alcohol used in the present invention is an alcohol having 4 to 14 carbons represented by the following general formula (3).

[Formula 15]

(3)

In the formula, $R_2$ represents a monovalent or divalent organic group having 4 to 14 carbon atoms, and p represents an integer of 1 to 2.

Specific examples thereof include cyclopropyl carbinol, 2-cyclohexen-1-ol, cyclohexanemethanol, 4-methyl-1-cyclohexanemethanol, 3,4-dimethylcyclohexanol, 4-ethylcyclohexanol, 4-t-butylocyclohexanol, cyclohexaneethanol, 3-cyclohexyl-1-propanol, 1-cyclohexyl-1-pentanol, 3,3,5-trimethylcyclohexanol, norbornane-2-methanol, cyclooctanol, 2,3,4-trimethyl-3-pentanol, 2,4-hexadien-1-ol, cis-2-hexen-1-ol, trans-2-hepten-1-ol, cis-4-hepten-1-ol, cis-3-octen-1-ol, 4-ethyl-1-octyn-3-ol, 2,7-octadienol, 3,6-dimethyl-1-heptyn-3-ol, 3-ethyl-2-methyl-3-pentanol, 2-ethyl-1-hexanol, 2,3-dimethyl-2-hexanol, 2,5-dimethyl-2-hexanol, trans, cis-2,6-nonadien-1-ol, 1-nonen-3-ol, cis-2butene-1,4-diol, 2,2-diethyl-1,3-propanediol, 2,4-diethyl-1, 5-pentanediol, 1,5-hexadiene-3,4-diol, 2,5-dimethyl-3-hexyne-2,5-diol, 2,4,7,9-tetramethyl-5-decyne-4,7-diol, 2,2, 4,4-tetramethyl-1,3-cyclobutanediol, 1,2-cyclohexanediol, trans-p-menthane-3,8-diol, butyroin, and dimethoxybenzyl alcohol.

Among them, preferred is an alcohol having a structure represented by the following general formula (4).

[Formula 16]

(4)

In the formula, $R_3$ represents a monovalent organic group having a branched or cyclic structure or unsaturated double bonding and having 4 to 14 carbon atoms.

The alcohol added remains in a certain amount in the film after soft baking to exert the effect thereof. An alcohol having 3 carbons or less is not preferable because it may hardly remain in the film after soft baking. On the other hand, an alcohol having 15 carbons or more is not preferable because it very slightly dissolves uniformly in the composition. Particularly, the monovalent alcohol more preferably has 6 to 14 carbons. These alcohols may be used alone or in a mixture of 2 or more.

The above alcohol is preferably blended in an amount of 0.01 to 70 parts by mass, more preferably 0.1 to 50 parts by mass, still more preferably 1 to 40 parts by mass, particularly 5 to 30 parts by mass to 100 parts by mass of the hydroxypolyamide. The blending amount of the alcohol of 0.01 part by mass or more reduces the undeveloped residue of exposed areas, and 70 parts by mass or less renders the tensile elongation of the cured film good.

(E) Other Additives

The positive photosensitive resin composition of the present invention may also optionally contain a phenol compound, a dye, a surfactant or a bonding auxiliary for enhancing adhesion to a silicon wafer, which is known as an additive for a positive photosensitive resin composition.

The above additives will be more specifically described. Examples of the phenol compound include a ballast agent used in the above NQD compound; and para-cumylphenol; bisphenols; resorcinols; or linear phenol compounds (MtrisPC and MtetraPC (trade name) from: Honshu Chemical Industry Co., Ltd.); non-linear phenol compounds (TrisP-HAP, TrisP-PHBA and TrisP-PA (trade name) from Honshu Chemical Industry Co., Ltd.); diphenylmethanes in each of which the 2 to 5 hydrogen atoms of the phenyl groups are substituted with hydroxy groups; and 2,2-diphenylpropanes in each of which the 1 to 5 hydrogen atoms of the phenyl groups are substituted with hydroxy groups. Addition of the phenol compound enhances the adhesion of a relief pattern during development and can suppress the generation of the residue. The ballast agent refers to a phenol compound used as a raw material in the above NQD compound which is a phenol compound in which part of the phenolic hydrogen atoms is naphthoquinone diazide sulfonated.

The phenol compound is blended in an amount of preferably 0 to 50 parts by mass, more preferably 1 to 30 parts by mass to 100 parts by mass of the hydroxypolyamide. Addition of 50 parts by mass or less makes the heat-cured film satisfactorily heat-resistant.

Examples of the dye include methyl violet, crystal violet, and malachite green. The dye is blended in an amount of preferably 0 to 10 parts by mass to 100 parts by mass of the hydroxypolyamide. Addition of 10 parts by mass or less makes the heat-cured film satisfactorily heat-resistant.

Examples of the surfactant include a nonionic surfactant consisting of a polyglycol such as polypropylene glycol or polyoxyethylene lauryl ether, or a derivative thereof. Examples thereof also include a fluorine surfactant such as Florard (trade name, from Sumitomo 3M Ltd.), Megafack (trade name, from Dainippon Ink And Chemicals, Inc.) or Sulfron (trade name, Asahi Glass Co., Ltd.). In addition, examples thereof include an organic siloxane surfactant such as KP341 (trade name, from Shin-Etsu Chemical Co., Ltd.), DBE (trade name, from Chisso Corporation) or Glanol (trade name, from Kyoeisha Chemical Co., Ltd.). Addition of the surfactant can make the coating film less repellent on the wafer edge during the coating.

The surfactant is blended in an amount of preferably 0 to 10 parts by mass, more preferably 0.01 to 1 part by mass to 100 parts by mass of the hydroxypolyamide. Addition of 10 parts by mass or less makes the heat-cured film satisfactorily heat-resistant.

Examples of the bonding auxiliary include alkylimidazolines, butyric acid, polyhydroxystyrene, polyvinyl methyl ether, t-butyl novolac, epoxy polymers, and various silane coupling agents such as epoxy silane.

Preferred specific examples of the silane coupling agent include 3-mercaptopropyltrimethoxysilane (KBM803 (trade name) from Shin-Etsu Chemical Co., Ltd., Sila-Ace S810 (trade name) from Chisso Corporation), 3-mercaptopropyltriethoxysilane (SIM6475.0 (trade name) from AZmax Co., Ltd.), 3-mercaptopropyltrimethyldimethoxysilane (LS1375 (trade name) from Shin-Etsu Chemical Co., Ltd., SIM6474.0 (trade name) from AZmax Co., Ltd.), mercaptomethyltrimethoxysilane (SIM6473.5C (trade name) from AZmax Co., Ltd.), mercaptomethylmethyldimethoxysilane (SIM6473.0 (trade name) from AZmax Co., Ltd.), 3-mercaptopropyldiethoxymethoxysilane, 3-mercaptopropylethoxydimethoxysilane, 3-mercaptopropyltripropoxysilane, 3-mercaptopropyldiethoxypropoxysilane, 3-mercaptopropylethoxydipropoxysilane, 3-mercaptopropyldimethoxypropoxysilane, 3-mercaptopropylmethoxydipropoxysilane, 2-mercaptoethyltrimethoxysilane, 2-mercaptoethyldiethoxymethoxysilane, 2-mercaptoethylethoxydimethoxysilane, 2-mercaptoethyltripropoxysilane, 2-mercaptoethyltripropoxysilane, 2-mercaptoethylethoxydipropoxysilane, 2-mercaptoethyldimethoxypropoxysilane, 2-mercaptoethylmethoxydipropoxysilane, 4-mercaptobutyltrimethoxysilane, 4-mercaptobutyltriethoxysilane, 4-mercaptobutyltripropoxysilane, N-(3-triethoxysilylpropyl)urea (LS3610 (trade name) from Shin-Etsu Chemical Co., Ltd. or SIU9055.0 (trade name) from AZmax Co., Ltd.), N-(3-trimethoxysilylpropyl)urea (SIU9058.0 (trade name) from AZmax Co., Ltd.), N-(3-diethoxymethoxysilylpropyl)urea, N-(3-ethoxydimethoxysilylpropyl)urea, N-(3-tripropoxysilylpropyl)urea, N-(3-diethoxypropoxysilylpropyl)urea, N-(3-ethoxydipropoxysilylpropyl)urea, N-(3-dimethoxypropoxysilylpropyl)urea, N-(3-methoxydipropoxysilylpropyl)urea, N-(3-trimethoxysilylethyl)urea, N-(3-ethoxydimethoxysilylethyl)urea, N-(3-tripropoxysilylethyl)urea, N-(3-tripropoxysilylethyl)urea, N-(3-ethoxydipropoxysilylethyl)urea, N-(3-dimethoxypropoxysilylethyl)urea, N-(3-methoxydipropoxysilylethyl)urea, N-(3-trimethoxysilylbutyl)urea, N-(3-triethoxysilylbutyl)urea, N-(3-tripropoxysilylbutyl)urea, 3-(m-aminophenoxy)propyltrimethoxysilane (SLA0598.0 (trade name) from AZmax Co., Ltd.), m-aminophenyltrimethoxysilane (SLA0599.0 (trade name) from AZmax Co., Ltd.), p-aminophenyltrimethoxysilane (SLA0599.1 (trade name) from AZmax Co., Ltd.), aminophenyltrimethoxysilane (SLA0599.2 (trade name) from AZmax Co., Ltd.), 2-(trimethoxysilylethyl)pyridine (SIT8396.0 (trade name) from AZmax Co., Ltd.), 2-(triethoxysilylethyl)pyridine, 2-(dimethoxysilylmethylethyl)pyridine, 2-(diethoxysilylmethylethyl)pyridine, (3-triethoxysilylpropyl)-t-butylcarbamate, and (3-glycidoxypropyl)triethoxysilane. In addition, particularly preferred examples thereof include, but not limited to, the following structures.

[Formula 17]

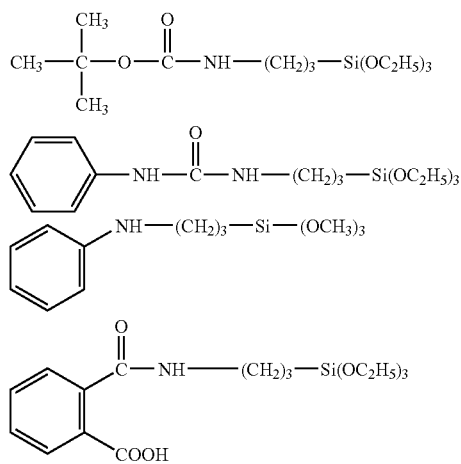

The bonding auxiliary is blended in an amount of preferably 0 to 20 parts by mass, more preferably 0.05 to 10 part by mass, still more preferably 0.1 to 5 parts by mass, particularly 1 to 5 parts by mass to 100 parts by mass of the hydroxypolyamide. Addition of 20 parts by mass or less of the silicon coupling agent makes the temporal stability of the adhesion favorable.

According to the present invention, these components are preferably used as a positive photosensitive resin composition by dissolving them in a solvent to make into varnish form. However, the solvent used in the present invention shall be other than that falling under the (D) alcohol. The solvent used may be N-methyl-2-pyrrolidone, γ-butyrolactone (hereinafter also referred to as "GBL"), cyclopentanone, cyclohexanone, isophorone, N,N-dimethylacetamide (hereinafter also referred to as "DMAc"), dimethylimidazolinone, tetramethylurea, dimethyl sulfoxide, diethylene glycol dimethyl ether (hereinafter also referred to as "DMDG"), diethylene glycol diethyl ether, diethylene glycol dibutyl ether, propylene glycol monomethyl ether acetate, methyl-1,3-butylene glycol acetate, methyl pyruvate, ethyl pyruvate, or methyl-3-methoxypropionate, etc. alone or a mixture thereof. Among these solvents, non-amide solvents are preferable in that they less affect a photoresist and the like. Preferred specific examples thereof can include γ-butyrolactone, propylene glycol monomethyl ether acetate, and diethylene glycol dimethyl ether.

The solvent is blended in an amount of preferably 50 to 1,000 parts by mass to 100 parts by mass of the hydroxypolyamide. The addition amount of the solvent defined in this range is preferable because it can provide a viscosity suitable for both a coating applicator and a coating thickness and thereby facilitate the production of a cured relief pattern.

<Process for Producing Cured Relief Pattern and Semiconductor Device>

Then, the process for producing the cured relief pattern of the present invention is specifically described below.

First, the positive photosensitive resin composition of the present invention is coated on a substrate such as a silicon wafer, a ceramic substrate or an aluminum substrate by spin-coating using a spinner or by using a coater (a dye coater or a roll coater). This is subjected to soft baking using an oven or a hot plate to remove the solvent. Conditions for soft baking are preferably 50 to 140° C.

Second, the resultant is subjected to exposure to actinic rays via a mask using a contact aligner or a stepper, or directly irradiated with light, electron beams or ion beams.

Third, the exposed or irradiated areas are eluted and removed with a developing solution, followed by rinsing with a rinse to provide a desired relief pattern. A spray, paddle, dipping or ultrasonic method is possible as a developing method. Distilled water or deionized water may be used as a rinse.

The developing solution used to develop the film formed by the positive photosensitive resin composition of the present invention is intended to dissolve and remove an alkali-soluble polymer and is required to be an alkaline aqueous solution in which an alkali compound is dissolved. The alkali compound dissolved in the developing solution may be an inorganic alkali compound or an organic alkali compound.

Examples of the inorganic alkali compound include lithium hydroxide, sodium hydroxide, potassium hydroxide, diammonium hydrogen phosphate, dipotassium hydrogen phosphate, disodium hydrogen phosphate, lithium silicate, sodium silicate, potassium silicate, lithium carbonate, sodium carbonate, potassium carbonate, lithium borate, sodium borate, potassium borate, and ammonia.

Examples of the organic alkali compound include tetramethylammonium hydroxide, tetraethylammonium hydroxide, trimethylhydroxyethylammonium hydroxide, methylamine, dimethylamine, trimethylamine, monoethylamine, diethylamine, triethylamine, n-propylamine, di-n-propylamine, isopropylamine, diisopropylamine, methyldiethylamine, dimethylethanolamine, ethanolamine, and triethanolamine.

In addition, the alkaline aqueous solution may optionally contain appropriate amounts of a water-soluble organic solvent (e.g., methanol, ethanol, propanol, and ethylene glycol), a surfactant, a storage stabilizer, and a dissolution inhibitor for the resin.

Finally, the resultant relief pattern is subjected to heat treatment to form a heat-resistant cured relief pattern composed of a resin having a polybenzoxazole structure.

The semiconductor device of the present invention can be produced by combining a known process for producing a semiconductor device with the use of the cured relief pattern of the present invention as a passivation film, an interlayer insulating film, an insulating film for rewiring, a protection film for a flip-chip device, or a protection film for a device having a bump structure.

The positive photosensitive resin composition of the present invention is also useful for use in the interlayer insulation of a multilayered circuit, a cover coat for flexible copper-clad laminates, a solder mask film, or a liquid crystal alignment layer.

EXAMPLES

The present invention will be described with reference to Reference Examples and Examples.

Reference Example 1

<Synthesis of Hydroxypolyamide>

In a 2-litter separable flask were mixed and stirred 197.8 g (0.54 mole) of 2,2-bis(3-amino-4-hydroxyphenyl)-hexafluoropropane, 75.9 g (0.96 mole) of pyridine and 692 g of DMAc at room temperature (25° C.) for dissolution. To the resultant solution was dropwise added, through a dropping funnel, 19.7 g (0.12 mole) of 5-norbornene-2,3-dicarboxylic anhydride separately dissolved in 88 g of DMDG. The time required for the dropwise addition was 40 minutes, and the reaction solution temperature was up to 28° C.

After the end of dropwise addition, the reaction solution was warmed to 50° C. in a hot water bath and stirred for 18 hours, followed by measuring the IR spectrum of the reaction solution to identify the appearance of the characteristic absorptions of imide group at 1,385 cm$^{-1}$ and 1,772 cm$^{-1}$.

Subsequently, the reaction solution was cooled to 8° C. in a water bath, and thereto was dropwise added, through a dropping funnel, 142.3 g (0.48 mole) of 4,4'-diphenylether dicarboxylic acid dichloride separately dissolved in 398 g of DMDG. The time required for the dropwise addition was 80 minutes, and the reaction solution temperature was up to 12° C. Three hours after the end of dropwise addition, the reaction solution was dropwise added to 12 l of water under high-speed stirring to disperse and precipitate a polymer. The precipitate was recovered, washed with water appropriately, dewatered, and subjected to vacuum drying to provide a hydroxypolyamide (P-1). The hydroxypolyamide thus synthesized had a weight average molecular weight of 14,000 in polystyrene equivalent as measured by GPC. The analysis conditions for GPC are described below.

Column: Shodex (trade name) 805/804/803 in series manufactured by Showa Denko KK
Eluent: tetrahydrofuran, 40° C.
Flow rate: 1.0 ml/minute
Detector: Shodex (trade name) RI SE-61 manufactured by Showa Denko KK Reference Example 2

<Synthesis of Photo-acid Generator>

In a 1-litter separable flask were placed 109.9 g (0.3 mole) of 2,2-bis(3-amino-4-hydroxyphenyl)-hexafluoropropane, 330 g of tetrahydrofuran (hereinafter also referred to as "THF") and 47.5 g (0.6 mole) of pyridine, and 98.5 g (0.6 mole) of 5-norbornene-2,3-dicarboxylic anhydride was added thereto, at room temperature, in the form of powder as it was. A stirring reaction was then conducted at room temperature in the above state for 3 days before identifying the reaction by HPLC, resulting in detecting a product with a purity of 99% as a single peak without detecting any raw material. This reaction solution was directly added dropwise to 1 L of ion exchanged water under stirring before filtering off the precipitate, and 500 mL of THF was then added thereto with stirring to dissolve it. The resultant homogeneous solution was passed through a glass column packed with 100 g of Amberlyst 15, a cation exchange resin (from Organo Co., Ltd.), to remove the remaining pyridine. Subsequently, this solution was added dropwise to 3 l of ion exchanged water under high-speed stirring to precipitate a product, which was then filtered off before vacuum drying.

Imidation in the product was identified by the appearance of characteristic absorptions of the imide group at 1,394 cm$^{-1}$ and 1,774 cm$^{-1}$ and the absence of characteristic absorptions of the amide group near 1,540 cm$^{-1}$ and 1,650 cm$^{-1}$ in the IR spectrum, and the absence of peaks of protons of amide and carboxylic acid in the NMR spectrum.

To 560 g of acetone were then added 65.9 g (0.1 mole) of the above-described product and 53.7 g (0.2 mole) of 1,2-naphthoquinonediazide-4-sulfonyl chloride, followed by stirring and dissolving at 20° C. To this solution was dropwise added 21.2 g (0.21 mole) of triethylamine diluted with 106.2 g of acetone at a constant speed over a period of 30 minutes. Here, the reaction solution was temperature controlled in the range from 20 to 30° C. using an ice-water bath.

After the end of dropwise addition, the reaction solution was stirred and allowed to stand at 20° C. for further 30 minutes before throwing, thereinto at a time, 5.6 g of a hydrochloric acid aqueous solution having a concentration of 36% by weight. The reaction solution was then cooled in an ice-water bath, followed by suction-filtering off the precipitated solid. The resultant filtrate was added dropwise to 5 l of a hydrochloric acid aqueous solution having a concentration of 0.5 wt % under stirring over a period of one hour to precipitate the desired material, which was then recovered by suction-filtering off. The recovered cake-like material was again dispersed in 5 l of ion-exchanged water, followed by stirring, washing, and filtering off for recovery; this water-washing operation was repeated thrice. Finally, the obtained cake-like material was vacuum dried at 40° C. for 24 hours to provide a photo-acid generator (Q-1).

<Preparation of Positive Photosensitive Resin Composition>

Examples 1 to 60 and Comparative Examples 1 to 25

One hundred parts by mass of the hydroxypolyamide (P-1) obtained in the above Reference Example 1 and predetermined parts by mass of the photo-acid generator (Q-1) obtained in the above Reference Example 2, the carboxylic acid compound of each of the following C-1 to C-21 and the alcohol of each of the following D-1 to D13 were dissolved in 170 parts by mass of GBL, and the resulting solution was then filtered using a 0.2-µm filter to prepare each of the positive photosensitive resin compositions of Examples 1 to 60 and Comparative Examples 1 to 25 described in Tables 1 and 2.

(C-1) Sorbic Acid
(C-2) 2-Heptenoic Acid
(C-3) 2-Octenoic Acid
(C-4) Isononanoic Acid
(C-5) 2-Nonenoic Acid
(C-6) Lauric Acid
(C-7) 10-Undecenoic Acid.
(C-8) 2-Dodecenoic Acid
(C-9) 3-Cyclohexene-1-carboxylic Acid
(C-10) Decanoic Acid
(C-11) m-Anisic Acid
(C-12) m-Toluic Acid
(C-13) m-Tolylacetic Acid
(C-14) Benzoic Acid
(C-15) Oleic Acid
(C-16) Acetic Acid
(C-17) Erucic Acid
(C-18) N-Oleoylsalcolin
(C-19) 4,5-Dicarboxy-γ-pentadecanolactone
(C-20) 2,2-Biphenyl Dicarboxylic Acid
(C-21) Diphenyl Ether Dicarboxylic Acid
(D-1) 1,5-Hexadiene-3,4-diol
(D-2) 2,3,4-Trimethyl-3-pentanol
(D-3) 2,3-Dimethyl-2-hexanol
(D-4) Cyclohexanemethanol
(D-5) cis-2-Butene-1,4-diol
(D-6) cis-2-Hexen-1-ol
(D-7) 2,4,7,9-Tetramethyl-5-decyne-4,7-diol
(D-8) Hexanol
(D-9) 4-Ethyl-1-octyn-3-ol
(D-10) Cyclopropylcarbinol
(D-11) Ethanol
(D-12) 1-Hexadecanol
(D-13) Oleyl Alcohol <Evaluation of Positive Photosensitive Resin Composition>

(1) Evaluation of Patterning Property

Each of the positive photosensitive resin compositions obtained in the above Examples and Comparative Examples was spin-coated on a 6-inch silicone wafer using a spin coater (Dspin636 from Dainippon Screen Mfg. Co., Ltd.), and then prebaked on a hot plate at 120° C. for 180 seconds to form a coating film having a thickness of 11.5 μm. The film thickness was measured using a film thickness measuring apparatus (Lambda Ace from Dainippon Screen Mfg. Co., Ltd.).

The coating film was exposed through a reticle having a test pattern by changing an exposure dose in stages using a stepper (NSR2005i8A from Nikon Corporation) having i-beam exposure wavelength (365 nm). The exposed coating film was developed at 23° C. using an alkali developing solution (AZ300MIF Developer: a 2.38% by mass tetramethylammonium hydroxide aqueous solution from AZ Electronic Materials Co., Ltd.) while adjusting the developing time so as to provide a film thickness of 9.8 μm after development, followed by rinsing with pure water to form a positive relief pattern. The sensitivity, resolution and adhesion state of each positive photosensitive resin composition are shown in Tables 3 and 4.

The sensitivity, resolution and adhesion of the positive photosensitive resin composition were evaluated as follows.

Sensitivity (mJ/cm$^2$):

The minimum exposure dose capable of completely dissolving and removing the exposed areas of the coating film in the above developing time Resolution (μm):

The minimum resolved pattern size with the above exposure dose

Adhesion (μm):

The size of a dissolved or peeled pattern with the above exposure dose

Developing Time:

The developing time required for the film thickness after development to reach 9.8 μm Remark:

Special comments are described.

TABLE 1

|  | Hydroxypolyamide | Photo-acid generator | Carboxylic acid compound | Alcohol |
|---|---|---|---|---|
| Example 1 | P-1 | Q-1 (18 parts by mass) | C-1 (15 parts by mass) | D-1 (15 parts by mass) |
| Example 2 | P-1 | Q-1 (18 parts by mass) | C-1 (15 parts by mass) | D-2 (15 parts by mass) |
| Example 3 | P-1 | Q-1 (18 parts by mass) | C-1 (15 parts by mass) | D-5 (15 parts by mass) |
| Example 4 | P-1 | Q-1 (18 parts by mass) | C-1 (15 parts by mass) | D-6 (15 parts by mass) |
| Example 5 | P-1 | Q-1 (18 parts by mass) | C-2 (15 parts by mass) | D-1 (15 parts by mass) |
| Example 6 | P-1 | Q-1 (18 parts by mass) | C-2 (15 parts by mass) | D-2 (15 parts by mass) |
| Example 7 | P-1 | Q-1 (18 parts by mass) | C-2 (15 parts by mass) | D-3 (15 parts by mass) |
| Example 8 | P-1 | Q-1 (18 parts by mass) | C-2 (15 parts by mass) | D-4 (15 parts by mass) |
| Example 9 | P-1 | Q-1 (18 parts by mass) | C-3 (15 parts by mass) | D-1 (15 parts by mass) |
| Example 10 | P-1 | Q-1 (18 parts by mass) | C-3 (15 parts by mass) | D-2 (15 parts by mass) |
| Example 11 | P-1 | Q-1 (18 parts by mass) | C-3 (15 parts by mass) | D-3 (15 parts by mass) |
| Example 12 | P-1 | Q-1 (18 parts by mass) | C-3 (15 parts by mass) | D-4 (15 parts by mass) |
| Example 13 | P-1 | Q-1 (18 parts by mass) | C-3 (15 parts by mass) | D-6 (15 parts by mass) |
| Example 14 | P-1 | Q-1 (18 parts by mass) | C-3 (15 parts by mass) | D-7 (15 parts by mass) |
| Example 15 | P-1 | Q-1 (18 parts by mass) | C-4 (15 parts by mass) | D-1 (15 parts by mass) |
| Example 16 | P-1 | Q-1 (18 parts by mass) | C-4 (15 parts by mass) | D-2 (15 parts by mass) |
| Example 17 | P-1 | Q-1 (20 parts by mass) | C-4 (20 parts by mass) | D-2 (20 parts by mass) |
| Example 18 | P-1 | Q-1 (18 parts by mass) | C-4 (15 parts by mass) | D-4 (15 parts by mass) |
| Example 19 | P-1 | Q-1 (18 parts by mass) | C-4 (15 parts by mass) | D-6 (15 parts by mass) |
| Example 20 | P-1 | Q-1 (18 parts by mass) | C-5 (15 parts by mass) | D-1 (15 parts by mass) |
| Example 21 | P-1 | Q-1 (18 parts by mass) | C-5 (15 parts by mass) | D-2 (15 parts by mass) |
| Example 22 | P-1 | Q-1 (18 parts by mass) | C-5 (15 parts by mass) | D-3 (15 parts by mass) |
| Example 23 | P-1 | Q-1 (18 parts by mass) | C-5 (15 parts by mass) | D-4 (15 parts by mass) |
| Example 24 | P-1 | Q-1 (18 parts by mass) | C-5 (15 parts by mass) | D-5 (15 parts by mass) |
| Example 25 | P-1 | Q-1 (18 parts by mass) | C-5 (15 parts by mass) | D-6 (15 parts by mass) |
| Example 26 | P-1 | Q-1 (18 parts by mass) | C-5 (15 parts by mass) | D-7 (15 parts by mass) |
| Example 27 | P-1 | Q-1 (18 parts by mass) | C-6 (15 parts by mass) | D-1 (15 parts by mass) |
| Example 28 | P-1 | Q-1 (18 parts by mass) | C-6 (15 parts by mass) | D-2 (15 parts by mass) |
| Example 29 | P-1 | Q-1 (18 parts by mass) | C-6 (15 parts by mass) | D-3 (15 parts by mass) |
| Example 30 | P-1 | Q-1 (18 parts by mass) | C-6 (15 parts by mass) | D-4 (15 parts by mass) |
| Example 31 | P-1 | Q-1 (18 parts by mass) | C-6 (15 parts by mass) | D-8 (15 parts by mass) |
| Example 32 | P-1 | Q-1 (18 parts by mass) | C-7 (15 parts by mass) | D-1 (15 parts by mass) |
| Example 33 | P-1 | Q-1 (18 parts by mass) | C-7 (15 parts by mass) | D-2 (15 parts by mass) |
| Example 34 | P-1 | Q-1 (18 parts by mass) | C-7 (15 parts by mass) | D-2 (25 parts by mass) |
| Example 35 | P-1 | Q-1 (18 parts by mass) | C-7 (15 parts by mass) | D-3 (15 parts by mass) |
| Example 36 | P-1 | Q-1 (18 parts by mass) | C-7 (15 parts by mass) | D-4 (15 parts by mass) |
| Example 37 | P-1 | Q-1 (18 parts by mass) | C-7 (15 parts by mass) | D-6 (15 parts by mass) |
| Example 38 | P-1 | Q-1 (18 parts by mass) | C-8 (15 parts by mass) | D-1 (15 parts by mass) |
| Example 39 | P-1 | Q-1 (18 parts by mass) | C-8 (15 parts by mass) | D-2 (15 parts by mass) |
| Example 40 | P-1 | Q-1 (18 parts by mass) | C-8 (15 parts by mass) | D-3 (15 parts by mass) |
| Example 41 | P-1 | Q-1 (18 parts by mass) | C-8 (15 parts by mass) | D-6 (15 parts by mass) |
| Example 42 | P-1 | Q-1 (18 parts by mass) | C-9 (15 parts by mass) | D-1 (15 parts by mass) |
| Example 43 | P-1 | Q-1 (18 parts by mass) | C-9 (5 parts by mass) | D-2 (15 parts by mass) |
| Example 44 | P-1 | Q-1 (20 parts by mass) | C-9 (15 parts by mass) | D-2 (5 parts by mass) |
| Example 45 | P-1 | Q-1 (18 parts by mass) | C-9 (15 parts by mass) | D-2 (15 parts by mass) |

TABLE 2

|  | Hydroxypolyamide | Photo-acid generator | Carboxylic acid compound | Alcohol |
|---|---|---|---|---|
| Example 46 | P-1 | Q-1 (18 parts by mass) | C-9 (15 parts by mass) | D-2 (30 parts by mass) |
| Example 47 | P-1 | Q-1 (20 parts by mass) | C-9 (20 parts by mass) | D-2 (15 parts by mass) |
| Example 48 | P-1 | Q-1 (18 parts by mass) | C-9 (15 parts by mass) | D-3 (15 parts by mass) |
| Example 49 | P-1 | Q-1 (18 parts by mass) | C-9 (15 parts by mass) | D-4 (15 parts by mass) |
| Example 50 | P-1 | Q-1 (18 parts by mass) | C-9 (15 parts by mass) | D-5 (15 parts by mass) |
| Example 51 | P-1 | Q-1 (18 parts by mass) | C-9 (15 parts by mass) | D-6 (15 parts by mass) |
| Example 52 | P-1 | Q-1 (18 parts by mass) | C-9 (20 parts by mass) | D-10 (10 parts by mass) |
| Example 53 | P-1 | Q-1 (19 parts by mass) | C-11 (10 parts by mass) | D-2 (17 parts by mass) |
| Example 54 | P-1 | Q-1 (19 parts by mass) | C-11 (10 parts by mass) | D-3 (15 parts by mass) |
| Example 55 | P-1 | Q-1 (19 parts by mass) | C-12 (10 parts by mass) | D-2 (17 parts by mass) |
| Example 56 | P-1 | Q-1 (19 parts by mass) | C-12 (10 parts by mass) | D-3 (15 parts by mass) |
| Example 57 | P-1 | Q-1 (19 parts by mass) | C-13 (10 parts by mass) | D-2 (17 parts by mass) |
| Example 58 | P-1 | Q-1 (19 parts by mass) | C-13 (10 parts by mass) | D-3 (15 parts by mass) |
| Example 59 | P-1 | Q-1 (18 parts by mass) | C-14 (10 parts by mass) | D-2 (17 parts by mass) |
| Example 60 | P-1 | Q-1 (18 parts by mass) | C-15 (7 parts by mass) | D-2 (17 parts by mass) |
| Comparative Example 1 | P-1 | Q-1 (18 parts by mass) | None | None |
| Comparative Example 2 | P-1 | Q-1 (20 parts by mass) | None | D-2 (15 parts by mass) |
| Comparative Example 3 | P-1 | Q-1 (18 parts by mass) | None | D-5 (15 parts by mass) |
| Comparative Example 4 | P-1 | Q-1 (18 parts by mass) | None | D-9 (15 parts by mass) |
| Comparative Example 5 | P-1 | Q-1 (18 parts by mass) | C-12 (10 parts by mass) | D-12 (15 parts by mass) |
| Comparative Example 6 | P-1 | Q-1 (18 parts by mass) | C-12 (10 parts by mass) | D-13 (15 parts by mass) |
| Comparative Example 7 | P-1 | Q-1 (18 parts by mass) | C-16 (15 parts by mass) | D-2 (15 parts by mass) |
| Comparative Example 8 | P-1 | Q-1 (18 parts by mass) | C-16 (15 parts by mass) | D-11 (15 parts by mass) |
| Comparative Example 9 | P-1 | Q-1 (18 parts by mass) | C-17 (15 parts by mass) | D-2 (15 parts by mass) |
| Comparative Example 10 | P-1 | Q-1 (18 parts by mass) | C-18 (15 parts by mass) | D-2 (15 parts by mass) |
| Comparative Example 11 | P-1 | Q-1 (18 parts by mass) | C-19 (5 parts by mass) | None |
| Comparative Example 12 | P-1 | Q-1 (18 parts by mass) | C-19 (10 parts by mass) | None |
| Comparative Example 13 | P-1 | Q-1 (18 parts by mass) | C-19 (10 parts by mass) | D-2 (15 parts by mass) |
| Comparative Example 14 | P-1 | Q-1 (18 parts by mass) | C-19 (12 parts by mass) | None |
| Comparative Example 15 | P-1 | Q-1 (18 parts by mass) | C-20 (5 parts by mass) | None |
| Comparative Example 16 | P-1 | Q-1 (18 parts by mass) | C-20 (10 parts by mass) | None |
| Comparative Example 17 | P-1 | Q-1 (18 parts by mass) | C-20 (10 parts by mass) | D-2 (15 parts by mass) |
| Comparative Example 18 | P-1 | Q-1 (18 parts by mass) | C-20 (15 parts by mass) | None |
| Comparative Example 19 | P-1 | Q-1 (18 parts by mass) | C-21 (5 parts by mass) | None |
| Comparative Example 20 | P-1 | Q-1 (18 parts by mass) | C-21 (10 parts by mass) | None |
| Comparative Example 21 | P-1 | Q-1 (18 parts by mass) | C-21 (10 parts by mass) | D-2 (15 parts by mass) |
| Comparative Example 22 | P-1 | Q-1 (20 parts by mass) | C-1 (15 parts by mass) | None |
| Comparative Example 23 | P-1 | Q-1 (18 parts by mass) | C-9 (15 parts by mass) | None |
| Comparative Example 24 | P-1 | Q-1 (18 parts by mass) | C-10 (15 parts by mass) | None |
| Comparative Example 25 | P-1 | Q-1 (18 parts by mass) | C-14 (10 parts by mass) | None |

TABLE 3

|  | Sensitivity | Resolution | Adhesion (μm) | Developing time (sec.) | Remark |
|---|---|---|---|---|---|
| Example 1 | 220 | 3.0 | Dissolved 4.0 | 80 | — |
| Example 2 | 230 | 3.0 | Dissolved 3.0 | 84 | — |
| Example 3 | 240 | 3.0 | Dissolved 4.5 | 88 | — |
| Example 4 | 245 | 3.0 | Dissolved 3.0 | 88 | — |

TABLE 3-continued

|  | Sensitivity | Resolution | Adhesion (μm) | Developing time (sec.) | Remark |
|---|---|---|---|---|---|
| Example 5 | 215 | 3.0 | Dissolved 5.5 | 114 | — |
| Example 6 | 225 | 3.0 | Dissolved 5.5 | 120 | — |
| Example 7 | 240 | 3.0 | Dissolved 6.0 | 118 | — |
| Example 8 | 235 | 3.0 | Dissolved 5.0 | 128 | — |
| Example 9 | 215 | 3.0 | Dissolved 3.5 | 92 | — |
| Example 10 | 220 | 3.0 | Dissolved 3.0 | 94 | — |
| Example 11 | 225 | 3.0 | Dissolved 4.0 | 98 | — |
| Example 12 | 245 | 3.0 | Dissolved 3.0 | 114 | — |
| Example 13 | 240 | 3.0 | Dissolved 2.5 | 98 | — |
| Example 14 | 235 | 3.0 | Dissolved 3.0 | 80 | — |
| Example 15 | 235 | 3.0 | Dissolved 4.0 | 76 | — |
| Example 16 | 245 | 3.0 | Dissolved 2.0 | 80 | — |
| Example 17 | 220 | 3.0 | Dissolved 3.5 | 78 | — |
| Example 18 | 255 | 3.0 | Dissolved 3.0 | 94 | — |
| Example 19 | 260 | 3.0 | Dissolved 2.5 | 80 | — |
| Example 20 | 200 | 3.0 | Dissolved 3.5 | 90 | — |
| Example 21 | 215 | 3.0 | Dissolved 3.5 | 92 | — |
| Example 22 | 220 | 3.0 | Dissolved 3.5 | 96 | — |
| Example 23 | 225 | 3.0 | Dissolved 4.0 | 118 | — |
| Example 24 | 200 | 3.0 | Dissolved 5.5 | 100 | — |
| Example 25 | 220 | 3.0 | Dissolved 4.0 | 98 | — |
| Example 26 | 215 | 3.0 | Dissolved 5.0 | 82 | — |
| Example 27 | 220 | 3.0 | Dissolved 5.0 | 78 | — |
| Example 28 | 230 | 3.0 | Dissolved 5.5 | 80 | — |
| Example 29 | 240 | 3.0 | Dissolved 4.5 | 84 | — |
| Example 30 | 240 | 3.0 | Dissolved 4.5 | 106 | — |
| Example 31 | 275 | 3.0 | Dissolved 5.0 | 96 | — |
| Example 32 | 190 | 3.0 | Dissolved 5.5 | 84 | — |
| Example 33 | 200 | 3.0 | Dissolved 4.0 | 86 | — |
| Example 34 | 195 | 3.0 | Dissolved 5.0 | 94 | — |
| Example 35 | 205 | 3.0 | Dissolved 3.5 | 90 | — |
| Example 36 | 210 | 3.0 | Dissolved 3.5 | 112 | — |
| Example 37 | 215 | 3.0 | Dissolved 3.5 | 90 | — |
| Example 38 | 230 | 3.0 | Dissolved 4.5 | 80 | — |
| Example 39 | 235 | 3.0 | Dissolved 3.0 | 82 | — |
| Example 40 | 245 | 3.0 | Dissolved 2.5 | 86 | — |
| Example 41 | 240 | 3.0 | Dissolved 3.5 | 88 | — |
| Example 42 | 210 | 3.0 | Dissolved 3.5 | 80 | — |
| Example 43 | 235 | 3.0 | Dissolved 5.5 | 114 | — |
| Example 44 | 220 | 3.0 | Dissolved 2.0 | 80 | — |
| Example 45 | 220 | 3.0 | Dissolved 2.0 | 84 | — |
| Example 46 | 215 | 3.0 | Dissolved 2.5 | 86 | — |

TABLE 4

|  | Sensitivity | Resolution | Adhesion (μm) | Developing time (sec.) | Remark |
|---|---|---|---|---|---|
| Example 47 | 215 | 3.0 | Dissolved 2.0 | 74 | — |
| Example 48 | 230 | 3.0 | Dissolved 3.0 | 86 | — |
| Example 49 | 225 | 3.0 | Dissolved 2.0 | 108 | — |
| Example 50 | 210 | 3.0 | Dissolved 3.5 | 88 | — |
| Example 51 | 235 | 3.0 | Dissolved 2.0 | 86 | — |
| Example 52 | 225 | 3.0 | Dissolved 3.0 | 66 | — |
| Example 53 | 220 | 3.0 | Dissolved 2.0 | 82 | — |
| Example 54 | 225 | 3.0 | Dissolved 2.5 | 84 | — |
| Example 55 | 225 | 3.0 | Dissolved 2.0 | 72 | — |
| Example 56 | 230 | 3.0 | Dissolved 2.0 | 76 | — |
| Example 57 | 225 | 3.0 | Dissolved 2.0 | 74 | — |
| Example 58 | 235 | 3.0 | Dissolved 2.5 | 76 | — |
| Example 59 | 255 | 3.0 | Dissolved 5.0 | 114 | — |
| Example 60 | 275 | 3.0 | Dissolved 5.0 | 124 | — |
| Comparative Example 1 | 425 | 3.0 | Peeled 30 | 116 | — |
| Comparative Example 2 | 395 | 3.0 | Peeled 25 | 120 | — |
| Comparative Example 3 | 375 | 3.0 | Peeled 30 | 118 | — |
| Comparative Example 4 | 425 | 3.0 | Peeled 35 | 132 | — |
| Comparative Example 5 | — | — | — | — | Not dissolved in GBL |
| Comparative Example 6 | 435 | 3.5 | Peeled 50 | 170 | Crack generation in film |
| Comparative | 370 | 3.0 | Peeled 30 | 96 | — |

TABLE 4-continued

| | Sensitivity | Resolution | Adhesion (μm) | Developing time (sec.) | Remark |
|---|---|---|---|---|---|
| Example 7 | | | | | |
| Comparative Example 8 | 395 | 3.0 | Peeled 25 | 104 | — |
| Comparative Example 9 | — | — | — | — | Contaminant precipitation in coating film |
| Comparative Example 10 | 380 | 3.5 | Peeled 10 | 42 | — |
| Comparative Example 11 | 350 | 3.0 | Peeled 22 | 70 | — |
| Comparative Example 12 | 365 | 3.5 | Peeled 0 | 38 | — |
| Comparative Example 13 | 400 | 3.5 | Peeled 16 | 42 | — |
| Comparative Example 14 | 425 | 4 | Peeled 10 | 26 | — |
| Comparative Example 15 | 350 | 3.0 | Peeled 15 | 60 | — |
| Comparative Example 16 | 380 | 3.0 | Peeled 12 | 30 | — |
| Comparative Example 17 | 425 | 3.0 | Dissolved 4.0 | 32 | — |
| Comparative Example 18 | 450 | 3.5 | Peeled 12 | 20 | — |
| Comparative Example 19 | — | — | — | — | Not dissolved in GBL |
| Comparative Example 20 | — | — | — | — | Not dissolved in GBL |
| Comparative Example 21 | — | — | — | — | Not dissolved in GBL |
| Comparative Example 22 | 305 | 3.0 | Dissolved 8.0 | 68 | — |
| Comparative Example 23 | 295 | 3.0 | Peeled 6.5 | 66 | — |
| Comparative Example 24 | 305 | 3.0 | Peeled 10 | 106 | — |
| Comparative Example 25 | 305 | 3.0 | Peeled 6.5 | 104 | — |

INDUSTRIAL APPLICABILITY

The positive photosensitive resin composition of the present invention can be suitably used as a passivation film, an interlayer insulating film and an insulating film for rewiring for semiconductor devices, a protection film for flip-chip devices, a protection film for devices having a bump structure, an interlayer insulating film for multilayered circuits, a cover coat for flexible copper-clad laminate, a solder mask film, and a liquid crystal alignment layer.

The invention claimed is:

1. A positive photosensitive resin composition characterized by comprising (A) 100 parts by mass of a hydroxypolyamide having repeating units represented by the general formula (1):

[Formula 1]

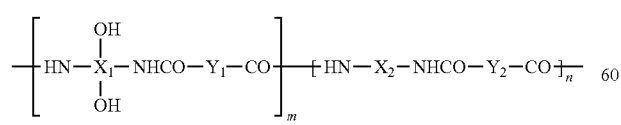

(1)

wherein $X_1$ represents a tetravalent organic group having at least two carbon atoms; $X_2$, $Y_1$, and $Y_2$ each independently represent a divalent organic group having at least two carbon atoms; m represents an integer of 2 to 1,000; n represents an integer of 0 to 500; $m/(m+n) > 0.5$; and m units of a dihydroxydiamide containing $X_1$ and $Y_1$ and n units of a diamide containing $X_2$ and $Y_2$ are sequenced in any order in combination with (B) 1 to 50 parts by mass of a photo-acid generator, (C) 5 to 20 parts by mass of a carboxylic acid compound having 6 to 18 carbon atoms represented by the general formula (2):

[Formula 2]

(2)

wherein $R_1$ represents a monovalent organic group having 5 to 17 carbon atoms, and (D) 0.01 to 70 parts by mass of an alcohol having 4 to 14 carbons represented by the general formula (3):

[Formula 3]

(3)

wherein $R_2$ represents a monovalent or divalent organic group having 4 to 14 carbon atoms, and p represents an integer of 1 to 2.

2. The positive photosensitive resin composition according to claim 1, wherein the (B) photo-acid generator is a compound having a naphthoquinone diazide structure.

3. The positive photosensitive resin composition according to any one of claims 1 to 2, wherein the (D) alcohol having 4 to 14 carbon atoms is a compound having a structure represented by the general formula (4):

[Formula 4]

$R_3$—OH  (4)

wherein $R_3$ represents a monovalent organic group having a branched structure, a cyclic structure or an unsaturated double bonding; and 4 to 14 carbon atoms.

4. A process for producing a cured relief pattern, characterized by comprising (1) forming the positive photosensitive resin composition according to any one of claims 1 or 2 in the form of a layer or a film on a substrate, (2) exposing the layer or a film to actinic rays via a mask, or directly irradiating it with light, electron beams or ion beams, (3) eluting and removing the exposed or irradiated areas, and (4) subjecting the resultant relief pattern to heat treatment.

5. A semiconductor device having the cured relief pattern obtained by the production process according to claim 4.

6. A process for producing a cured relief pattern, characterized by comprising (1) forming the positive photosensitive resin composition according to claim 3 in the form of a layer or a film on a substrate, (2) exposing the layer or a film to actinic rays via a mask, or directly irradiating it with light, electron beams or ion beams, (3) eluting and removing the exposed or irradiated areas, and (4) subjecting the resultant relief pattern to heat treatment.

7. A semiconductor device having the cured relief pattern obtained by the production process according to claim 6.

* * * * *